(12) United States Patent
Park et al.

(10) Patent No.: US 12,368,065 B2
(45) Date of Patent: Jul. 22, 2025

(54) WAFER PROCESSING APPARATUS

(71) Applicant: SAMSUNG ELECTRONICS CO., LTD., Suwon-si (KR)

(72) Inventors: Seungbeom Park, Gwangju (KR); Seunghwa Hyun, Suwon-si (KR); Kijoo Hong, Seongnam-si (KR); Taejoong Kim, Hwaseong-si (KR); Youngkyu Park, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 91 days.

(21) Appl. No.: 17/980,723

(22) Filed: Nov. 4, 2022

(65) Prior Publication Data

US 2023/0207356 A1  Jun. 29, 2023

(30) Foreign Application Priority Data

Dec. 24, 2021 (KR) .................. 10-2021-0187772

(51) Int. Cl.
*H01L 21/67* (2006.01)
*G03F 7/00* (2006.01)
*G06T 7/00* (2017.01)
*G06T 7/70* (2017.01)
(Continued)

(52) U.S. Cl.
CPC ...... *H01L 21/67259* (2013.01); *G03F 7/7065* (2013.01); *G06T 7/0004* (2013.01);
(Continued)

(58) Field of Classification Search
CPC ......... H01L 21/67259; H01L 21/67288; H01L 21/681; H01L 21/67253; H01L 21/6715;
(Continued)

(56) References Cited

U.S. PATENT DOCUMENTS 5,982,474 A * 11/1999 Akiyama .............. G03F 7/2026
355/53
7,289,661 B2 * 10/2007 Jun .................. H01L 21/67253
382/149
(Continued)

FOREIGN PATENT DOCUMENTS

| CN | 102856224 A | 1/2013 |
|---|---|---|
| KR | 10-0558176 B1 | 3/2006 |
| KR | 10-2007-0080511 A | 8/2007 |

*Primary Examiner* — Samira Monshi
(74) *Attorney, Agent, or Firm* — Muir Patent Law, PLLC

(57) ABSTRACT

A wafer processing apparatus includes an X-θ stage unit having a rotary chuck capable of moving in an X direction and rotating in a θ direction, wherein a wafer is mounted on the rotary chuck and the wafer includes an edge portion adjacent to an edge of the wafer. In addition, the wafer processing apparatus includes: an edge bead removal (EBR) measurement and eccentricity measurement unit which is capable of inspecting a bead removal state of the edge portion of the wafer, and measuring eccentricity between the center of the rotary chuck and the center of the wafer; and an edge exposure of wafer (EEW) process unit which exposes the edge portion of the wafer after correcting the eccentricity between the center of the rotary chuck and the center of the wafer measured by the EBR measurement and eccentricity measurement unit.

19 Claims, 26 Drawing Sheets

(51) Int. Cl.
*H04N 23/56* (2023.01)
*H04N 23/90* (2023.01)

(52) U.S. Cl.
CPC .......... *G06T 7/70* (2017.01); *H01L 21/67288* (2013.01); *H04N 23/56* (2023.01); *H04N 23/90* (2023.01); *G06T 2207/10056* (2013.01); *G06T 2207/30148* (2013.01)

(58) Field of Classification Search
CPC ........ H04N 23/56; H04N 23/80; H04N 23/90; G03F 7/7065; G03F 7/168; G03F 7/707; G03F 7/70725; G03F 7/2025; G03F 7/70653; G03F 7/70655; G03F 7/70681; G03F 7/706831; G03F 7/706833; G03F 7/706835; G03F 7/706841; G03F 7/706843; G06T 7/0004; G06T 7/70; G06T 2207/10056; G06T 2207/30148; G01N 21/9501; G01N 21/9503
USPC .......................................................... 348/87
See application file for complete search history.

(56) References Cited

U.S. PATENT DOCUMENTS

| | | | | |
|---|---|---|---|---|
| 7,691,559 | B2* | 4/2010 | Chang | H01L 21/6715 |
| | | | | 430/311 |
| 9,645,097 | B2* | 5/2017 | Nicolaides | G01N 21/9503 |
| 9,821,348 | B2* | 11/2017 | Wu | H01L 21/0209 |
| 11,822,261 | B2* | 11/2023 | Liang | G03F 1/00 |
| 2003/0030050 | A1* | 2/2003 | Choi | G03F 7/168 |
| | | | | 257/4 |
| 2004/0095575 | A1* | 5/2004 | Woo | G01N 21/9501 |
| | | | | 356/300 |
| 2006/0292714 | A1* | 12/2006 | Kim | H01L 21/681 |
| | | | | 438/16 |
| 2008/0124662 | A1* | 5/2008 | Yu | G03F 7/70725 |
| | | | | 430/323 |
| 2009/0116727 | A1* | 5/2009 | Jin | G01N 21/9503 |
| | | | | 382/149 |
| 2013/0005056 | A1* | 1/2013 | Kim | H01L 22/12 |
| | | | | 356/237.4 |

* cited by examiner

WAFER PROCESSING APPARATUS

CROSS-REFERENCE TO RELATED APPLICATION

This application is based on and claims priority under 35 U.S.C. § 119 to Korean Patent Application No. 10-2021-0187772, filed on Dec. 24, 2021, in the Korean Intellectual Property Office, the disclosure of which is incorporated by reference herein in its entirety.

BACKGROUND

1. Field

Embodiments relate to a wafer processing apparatus.

2. Description of the Related Art

A photolithography process may be performed to form a photoresist pattern on a wafer (a semiconductor wafer or semiconductor substrate). The photolithography process may include an edge bead removal (EBR) process for removing a photoresist film formed on an edge portion of a wafer, and an edge exposure of wafer (EEW) process for exposing an edge portion of the wafer.

SUMMARY

According to an embodiment, there is provided a wafer processing apparatus including: an X-θ stage unit having a rotary chuck capable of moving in an X direction (horizontal direction) and rotating in a θ direction (rotation direction), wherein a wafer is mounted on the rotary chuck and the wafer includes an edge portion adjacent to an edge of the wafer.

In addition, the wafer processing apparatus includes: an EBR measurement and eccentricity measurement unit which is located on an upper portion of the X-θ stage unit, and is capable of inspecting a bead removal state of the edge portion of the wafer, and measuring eccentricity between the center of the rotary chuck and the center of the wafer; and an EEW process unit which is located on an upper portion of the X-θ stage unit on one side of the EBR measurement and eccentricity measurement unit, and exposes the edge portion of the wafer after correcting the eccentricity between the center of the rotary chuck and the center of the wafer measured by the EBR measurement and eccentricity measurement unit.

According to an embodiment, there is provided a wafer processing apparatus including: an X-θ stage unit moving in an X direction (horizontal direction) and having a rotary chuck capable of rotating in a θ direction (rotation direction), wherein a wafer is mounted on the rotary chuck, and the wafer includes a first edge portion, adjacent to an edge, on which a photoresist film is not applied, and a second edge portion, adjacent to the first edge portion, on which a photoresist film is applied.

In addition, the wafer processing apparatus includes: an EBR measurement and eccentricity measurement unit which is located on an upper portion of the X-θ stage unit, and is capable of inspecting a bead removal state of the first edge portion of the wafer, and measuring eccentricity between the center of the rotary chuck and the center of the wafer; a macro defect inspection unit which is located on an upper portion of the X-θ stage unit on one side of the EBR measurement and eccentricity measurement unit and is capable of inspecting a surface state of the wafer; and an EEW process unit which is located on the upper part of the X-θ stage unit on one side of the macro defect inspection unit and exposes the first and second edge portions of the wafer after correcting the eccentricity between the center of the rotary chuck and the center of the wafer measured by the EBR measurement and eccentricity measurement unit.

According to an embodiment, there is provided a wafer processing apparatus including: an X-θ stage unit moving in an X direction (horizontal direction) and having a rotary chuck capable of rotating in a θ direction (rotation direction), wherein a wafer is mounted on the rotary chuck, and the wafer includes an edge portion, adjacent to an edge of the wafer.

In addition, the wafer processing apparatus includes: an EBR measurement and eccentricity measurement unit which is located on an upper portion of the X-θ stage unit, and includes a first image acquisition unit capable of inspecting a bead removal state of the edge portion of the wafer, and measuring eccentricity between the center of the rotary chuck and the center of the wafer; a macro defect inspection unit which is located on an upper portion of the X-θ stage unit on one side of the EBR measurement and eccentricity measurement unit and includes a second image acquisition unit capable of inspecting a surface state of the wafer; and an EEW process unit which is located on the upper part of the X-θ stage unit on one side of the macro defect inspection unit and includes a third optical system capable of exposing the edge portion of the wafer after correcting the eccentricity between the center of the rotary chuck and the center of the wafer measured by the EBR measurement and eccentricity measurement unit.

BRIEF DESCRIPTION OF THE DRAWINGS

Features will become apparent to those of skill in the art by describing in detail example embodiments with reference to the attached drawings in which.

DETAILED DESCRIPTION

Figure 1:
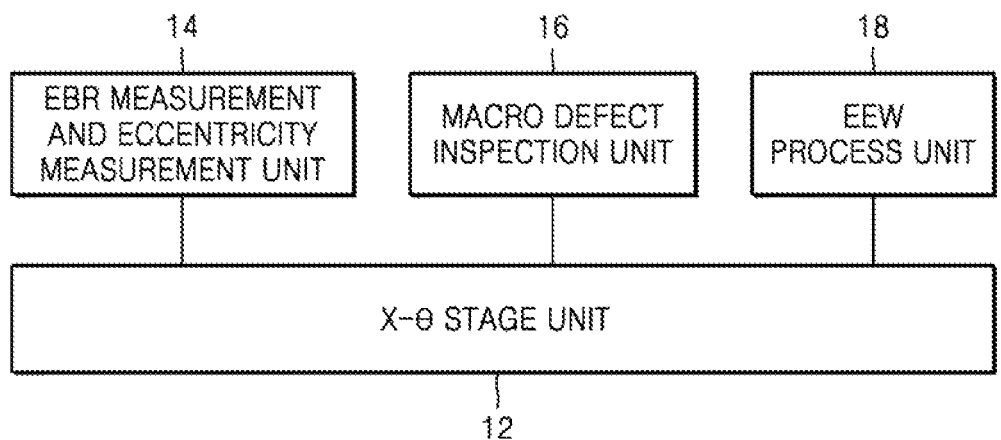
FIG. 1 is a block diagram illustrating a wafer processing apparatus according to an example embodiment.

FIG. 1 is a block diagram illustrating a wafer processing apparatus according to an example embodiment.

A wafer processing apparatus 10 may include an X-θ stage unit 12, an edge bead removal (EBR) measurement and eccentricity measurement unit 14, a macro defect inspection unit 16, and an edge exposure of wafer (EEW) process unit 18.

Figure 3:
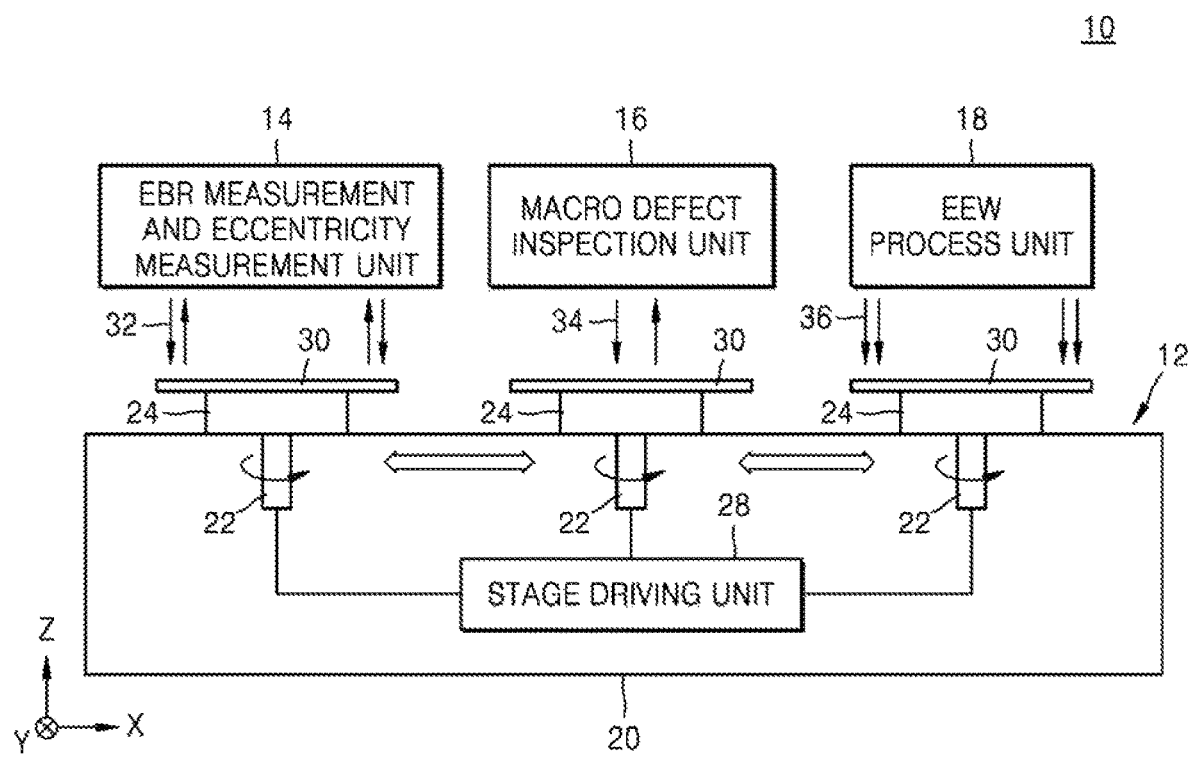
FIG. 3 is a sectional diagram illustrating a wafer processing apparatus according to an example embodiment.

The wafer processing apparatus 10 may process a wafer 30 (see, e.g., FIG. 3). An edge portion 30b of the wafer 30 (see, e.g., FIG. 6A) may be located adjacent to an edge 30c of the wafer 30 (see, e.g., FIG. 6A). The wafer 30 may have a photoresist film 70 thereon (see, e.g., FIG. 5). The photoresist film 70 may be formed (or formed and processed) such that the edge portion 30b is a first edge portion, in which the photoresist film 70 is not present, while, in a second edge portion 30d (adjacent to the first edge portion 30b), the photoresist film 70 is present (see, e.g., FIG. 8).

Referring to FIG. 1, the X-θ stage unit 12 may be mechanically and electrically connected to the EBR measurement and eccentricity measurement unit 14, the macro defect inspection unit 16, and the EEW process unit 18.

The X-θ stage unit 12 may be equipped with a rotary chuck capable of moving in the X direction (horizontal direction) and rotating in the θ direction (rotation direction), as described in further detail below. When a wafer is mounted on the rotary chuck, the wafer may also move in the X direction (horizontal direction) and rotate in the θ direction (rotation direction) in accordance with the movement and rotation of the rotary chuck.

The EBR measurement and eccentricity measurement unit 14 may be connected to the X-θ stage unit 12 to inspect a bead removal state of an edge portion of the wafer and measure an eccentricity between the center of the rotary chuck and the center of the wafer, as described in further detail below.

The macro defect inspection unit 16 may be connected to the X-θ stage unit 12 to inspect a defect in the surface state of the wafer, as described in further detail below. The EEW process unit 18 may expose the edge portion of the wafer, as described in further detail below. For convenience, an image processing unit for processing an image of a wafer captured by the EBR measurement and eccentricity measurement unit 14 and the macro defect inspection unit 16 is not shown in FIG. 1.

The wafer processing apparatus 10 according to an example embodiment includes the EBR measurement and eccentricity measurement unit 14 so as to easily measure the eccentricity between the center of the wafer and the center of the rotary chuck together with the EBR measurement. In other words, the wafer processing apparatus 10 may include the EBR measurement and eccentricity measurement unit 14 that measures EBR measurement and eccentricity together.

The wafer processing apparatus 10 according to an example embodiment may perform an EEW process in the EEW process unit 18 after correcting the eccentricity between the center of the wafer and the center of the rotary chuck, measured by the EBR measurement and eccentricity measurement unit 14.

In addition, the wafer processing apparatus 10 according to an example embodiment may inspect macro defects of the wafer between the EBR measurement and eccentricity measurement unit 14 and the EEW process unit 18 by using the X-θ stage unit 12 and the macro defect inspection unit 16.

As described above, the wafer processing apparatus 10 according to an example embodiment includes the X-θ stage unit 12, the EBR measurement and eccentricity measurement unit 14, the macro defect inspection unit 16, and the EEW process unit 18 to thus reduce a wafer processing time by reducing a wafer transfer time. The wafer processing apparatus 10 according to an example embodiment may significantly improve productivity of a device (facility) by reducing the wafer processing time.

Figure 2:
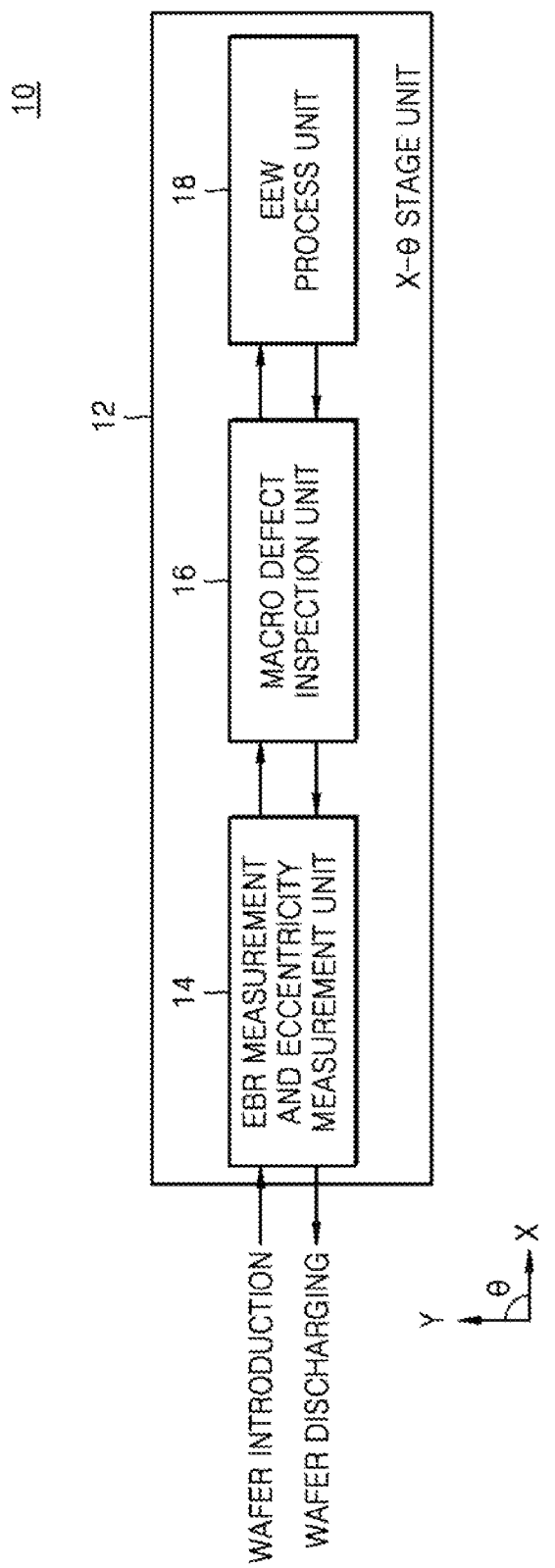
FIG. 2 is a top view illustrating a wafer processing apparatus according to an example embodiment.

FIG. 2 is a top view illustrating a wafer processing apparatus according to an example embodiment, and FIG. 3 is a sectional diagram illustrating a wafer processing apparatus according to an example embodiment.

The wafer processing apparatus 10 may include the X-θ stage unit 12, the EBR measurement and eccentricity measurement unit 14, the macro defect inspection unit 16, and the EEW process unit 18. The X-θ stage unit 12 may be equipped with a rotary chuck 24 capable of moving in the X direction (horizontal direction) and rotating in the θ direction (rotation direction). The rotary chuck 24 may be connected to a rotary shaft 22, and the rotary shaft 22 may be connected to a stage driving unit 28. The θ direction (rotation direction) may be a direction of rotation on the X-Y plane.

The rotary chuck 24 may be located on a stage body 20, and the rotary shaft 22 and the stage driving unit 28 may be located in the stage body 20. The wafer 30 may be mounted on the rotary chuck 24. As the rotary chuck 24 is moved in the X direction (horizontal direction) and rotated in the θ direction (horizontal direction) by the stage driving unit 28 of the X-θ stage unit 12, the wafer 30 may also move in the X direction (horizontal direction) and rotate in the θ direction (rotation direction).

The EBR measurement and eccentricity measurement unit 14 may be located above the X-θ stage unit 12. The wafer 30 may be introduced onto the rotary chuck 24 from one side of the EBR measurement and eccentricity measurement unit 14. The wafer 30 introduced onto the rotary chuck 24 in the EBR measurement and eccentricity measurement unit 14 may have the photoresist film 70 applied to a central portion thereof, and may have no photoresist film, which may be removed by an EBR process, at the edge portion 30b. The wafer 30 introduced onto the rotary chuck 24 in the EBR measurement and eccentricity measurement unit 14 may be the wafer 30 after having undergone the EBR process.

The EBR measurement and eccentricity measurement unit 14 may inspect a bead removal state of the edge portion 30b of the wafer 30 introduced to one side of the X-θ stage unit 12. In addition, the EBR measurement and eccentricity measurement unit 14 may measure eccentricity between the center of the rotary chuck 24 and the center of the wafer 30.

The EBR measurement and eccentricity measurement unit 14 may apply light 32 to the wafer 30 and obtain a first image captured by a first camera by using the light 32 reflected or diffracted from the wafer 30. The EBR measurement and eccentricity measurement unit 14 may analyze the first image to measure a bead removal state of the edge portion of the wafer 30 or an eccentricity between the center of the rotary chuck 24 and the center of the wafer 30.

The macro defect inspection unit 16 may be located above the X-θ stage unit 12 on one side of the EBR measurement and eccentricity measurement unit 14. The wafer 30 located on the rotary chuck 24 in the EBR measurement and eccentricity measurement unit 14 may be moved to the macro defect inspection unit 16 by the stage driving unit 28 of the X-θ stage unit 12. In FIG. 3, for convenience, rotary shafts 22, rotary chucks 24, and wafers 30 are separately illustrated below the EBR measurement and eccentricity measurement unit 14, and the macro defect inspection unit 16, respectively.

The macro defect inspection unit 16 may inspect the surface state of the wafer 30. The macro defect inspection unit 16 may apply light 34 to the wafer 30 and obtain a second image captured by a second camera by using the light 34 reflected or diffracted from the wafer 30. The macro defect inspection unit 16 may inspect the surface state of the wafer 30 by analyzing the second image.

The EEW process unit 18 may be located above the X-θ stage unit on one side of the macro defect inspection unit 16. The wafer 30 located on the rotary chuck 24 of the macro defect inspection unit 16 may be moved to the EEW process unit 18 by the stage driving unit 28 of the X-θ stage unit 12. In FIG. 3, for convenience, rotary shafts 22, rotary chucks 24, and wafers 30 are separately illustrated below the macro defect inspection unit 16, and the EEW process unit 18, respectively.

The EEW process unit 18 may perform an EEW process of exposing the edge portion of the wafer 30 after correcting the eccentricity between the center of the rotary chuck 24 and the center of the wafer 30, measured by the EBR measurement and eccentricity measurement unit 14. The EEW process unit 18 may apply light 36 to a photoresist film formed at the edge portion of the wafer 30.

The wafer 30 located on the rotary chuck 24 in the EEW process unit 18 may be discharged, after being subjected to the macro defect inspection unit 16 and the EBR measurement and eccentricity measurement unit 14, by the stage driving unit 28 of the X-θ stage unit 12. When the wafer 30 located on the rotary chuck 24 of the EEW process unit 18 moves to the macro defect inspection unit 16, the macro defect inspection unit 16 may additionally inspect the surface state of the wafer 30.

Figure 4:
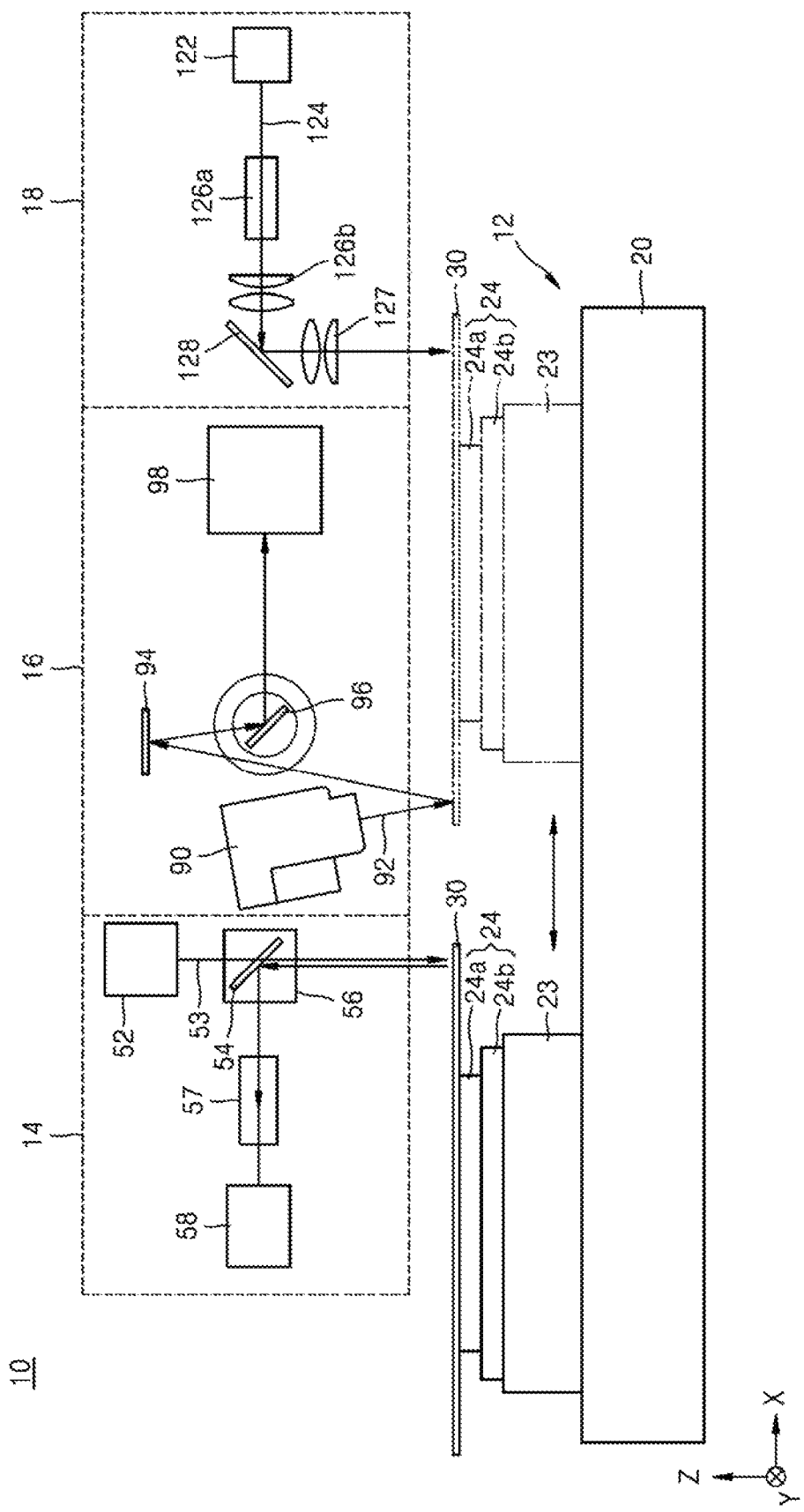
FIG. 4 is a sectional diagram illustrating a wafer processing apparatus according to an example embodiment.

FIG. 4 is a sectional diagram illustrating a wafer processing apparatus according to an example embodiment.

Specifically, in FIG. 4, the same components as in FIG. 3 will be briefly described or omitted. The wafer processing apparatus 10 may include the X-θ stage unit 12, the EBR measurement and eccentricity measurement unit 14, the macro defect inspection unit 16, and the EEW process unit 18.

The X-θ stage unit 12 may be equipped with the rotary chuck 24 capable of moving in the X direction (horizontal direction) and rotating in the θ direction (rotation direction). The rotary chuck 24 may be located on a support body 23 of the stage body 20. The rotary chuck 24 may include a first rotary chuck 24a having a small diameter located on the support body 23 and a second rotary chuck 24b having a large diameter supporting the first rotary chuck 24a.

The EBR measurement and eccentricity measurement unit 14 may be located on one side of the wafer processing apparatus 10. In the EBR measurement and eccentricity measurement unit 14, first light 53 emitted from a first light source 52 may be incident on the wafer 30 via a mirror module 56 including a mirror 54. The first light 53 of FIG. 4 may correspond to the light 32 of FIG. 3. The first light 53 reflected or diffracted from the wafer 30 may be incident on a first camera 58 via the mirror module 56 and a lens 57 to obtain a first image of the wafer 30.

The EBR measurement and eccentricity measurement unit 14 may analyze the first image obtained by the first camera 58 to measure a bead removal state of the edge portion 30b of the wafer 30 or an eccentricity between the center of the rotary chuck 24 and the center of the wafer 30.

The macro defect inspection unit 16 may be located above the X-θ stage unit 12 on one side of the EBR measurement and eccentricity measurement unit 14. In the macro defect inspection unit 16, second light 92 emitted from a second light source 90 may be incident on the wafer 30. The second light 92 of FIG. 4 may correspond to the light 34 of FIG. 3.

The second light 92 reflected or diffracted from the wafer 30 may be incident on a second camera 98 via mirrors 94 and 96 to obtain a second image of the wafer 30. The macro defect inspection unit 16 may inspect the surface state of the wafer 30 by analyzing the second image.

The EEW process unit 18 may be located above the X-θ stage unit on one side of the macro defect inspection unit 16. In the EEW process unit 18, third light 124 emitted from a third light source 122 may be incident on the wafer 30 via lenses 126a and 126b, a mirror 128, and a lens 127. The third light 124 of FIG. 4 may correspond to the light 36 of FIG. 3. The EEW process unit 18 may apply the third light 124 to the photoresist film formed at the edge portion of the wafer 30.

Figure 5:
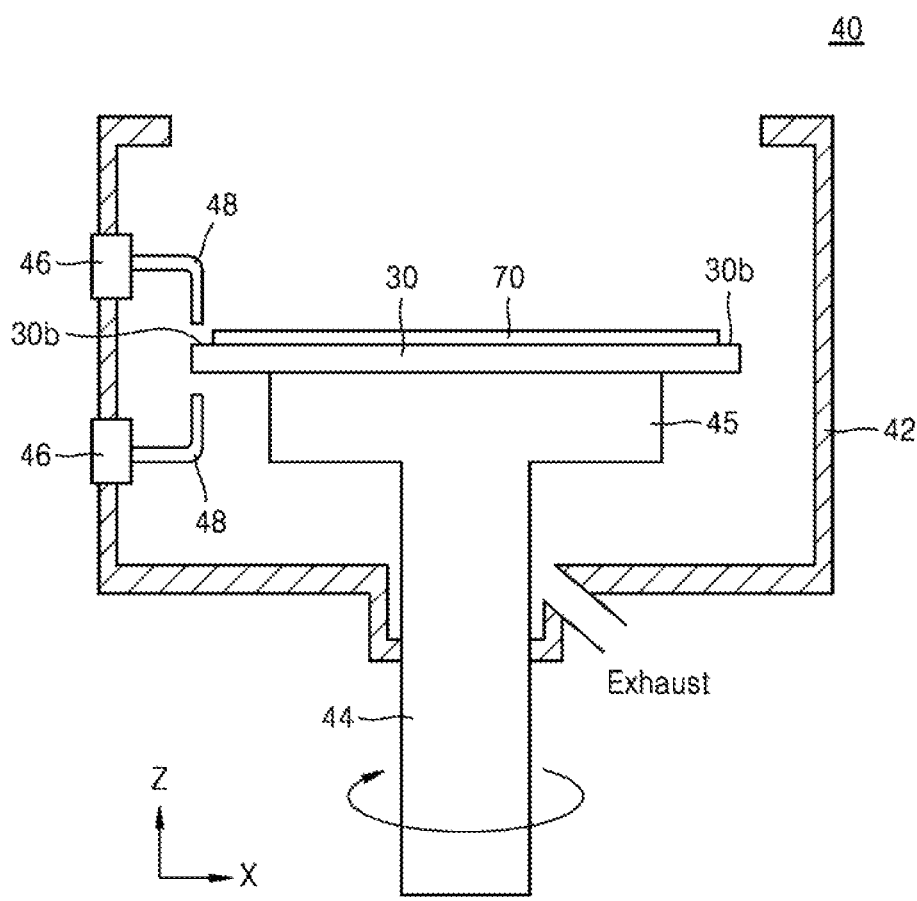
FIG. 5 is a cross-sectional view of an edge bead removal (EBR) device in which an EBR process is performed before being introduced into a wafer processing apparatus according to an example embodiment.

FIG. 5 is a cross-sectional view of an EBR device in which an EBR process is performed before being introduced into a wafer processing apparatus according to an example embodiment.

Specifically, an EBR device 40 may include a chamber 42, a rotary chuck 45, on which the wafer 30 is mounted, and a rotary shaft 44 connected to the rotary chuck 45. In addition, the EBR device 40 may include a rinse supply unit 46 and an edge rinse nozzle 48 located on one side wall of the chamber 42, in which a rinse liquid is contained in the rinse supply unit 46 and supplied via the edge rinse nozzle 48.

The photoresist film 70 may be coated on the wafer 30. The photoresist film 70 may be applied on the wafer 30 via a photoresist coating nozzle (not shown) positioned on the rotary chuck 45 of the EBR device 40 of FIG. 5, or may be applied by a separate device.

As the rotary shaft 44 and the rotary chuck 45 of the EBR device 40 rotate, the wafer 30 may also rotate. The EBR process is a process of removing beads from the edge portion 30b of the rotating wafer 30 by spraying a rinse liquid, for example, a thinner, through the edge rinse nozzle 48, at the edge portion 30b of the wafer 30. The EBR process may be a process of preventing the beads remaining at the edge portion 30b of the wafer 30 from acting as a contamination source in a subsequent semiconductor manufacturing process, by removing the beads remaining at the edge portion 30b of the wafer 30.

Figure 6A:
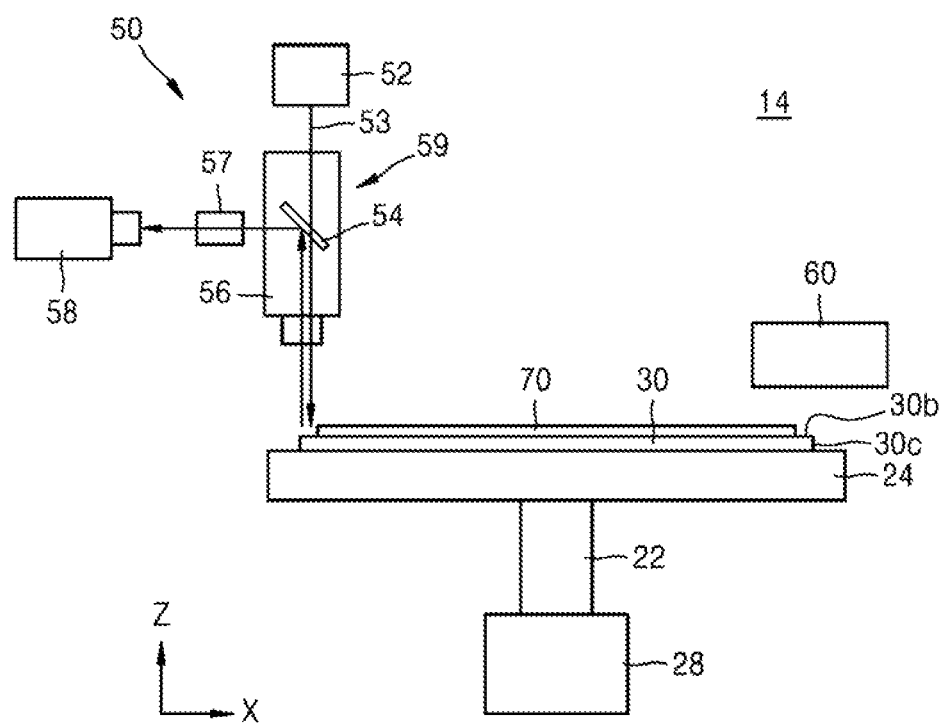
FIGS. 6A and 6B are a cross-sectional view and a perspective view, respectively, illustrating an EBR measurement and eccentricity measurement unit used in a wafer processing apparatus according to an example embodiment.
Figure 6B:
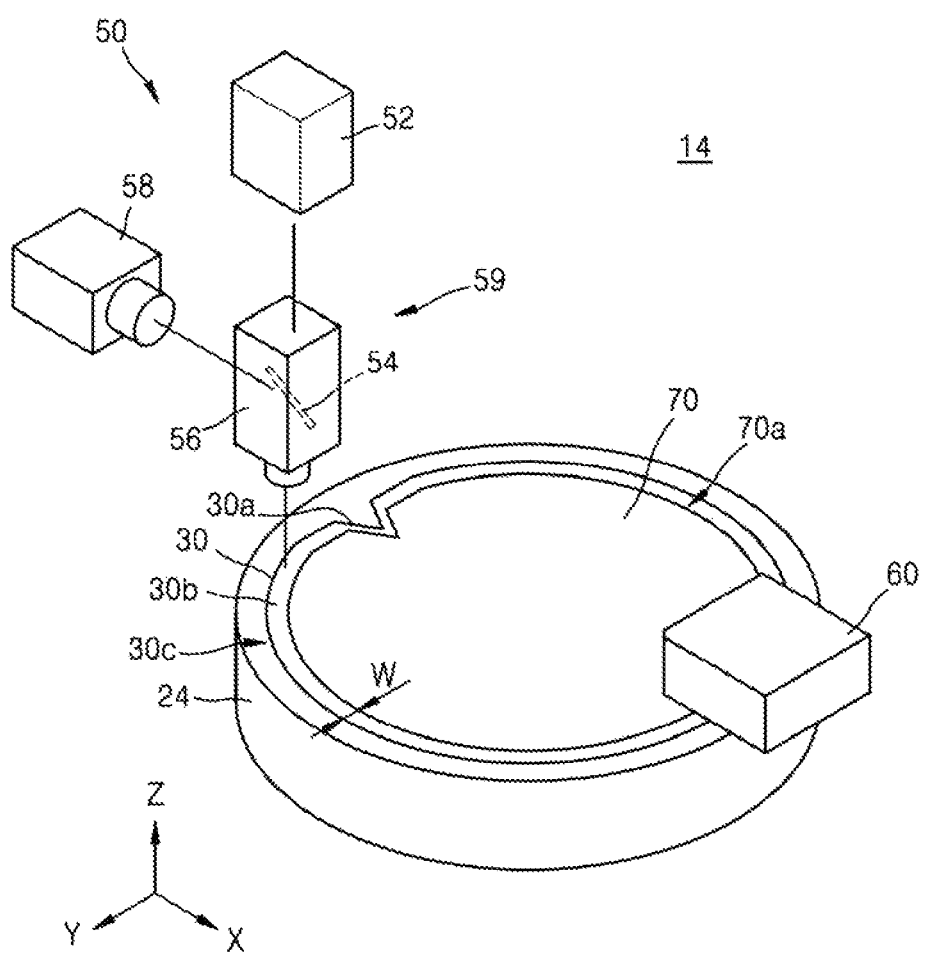
Figure 7:
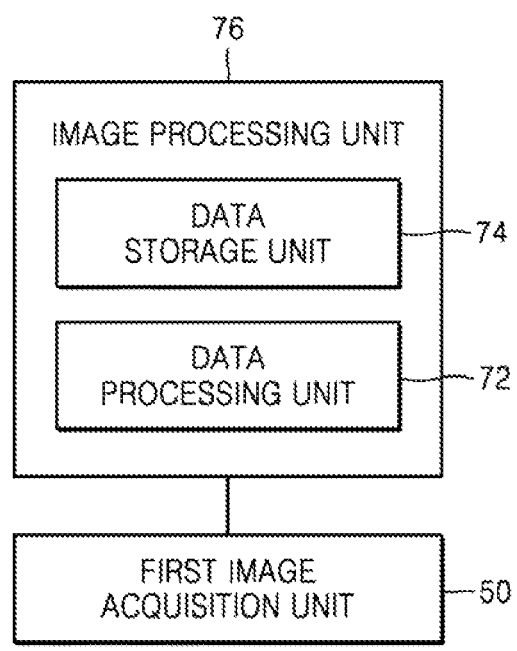
FIG. 7 is a block diagram illustrating image processing of the EBR measurement and eccentricity measurement unit of FIGS. 6A and 6B.

FIGS. 6A and 6B are a cross-sectional view and a perspective view, respectively, illustrating an EBR measurement and eccentricity measurement unit used in a wafer processing apparatus according to an example embodiment, and FIG. 7 is a block diagram illustrating image processing of the EBR measurement and eccentricity measurement unit of FIGS. 6A and 6B.

Specifically, in FIGS. 6A, 6B, and 7, the same reference numerals as in FIGS. 1 to 5 represent the same members. The wafer 30, after the EBR process is completed as described above, may be transferred to the rotary chuck 24 of the wafer processing apparatus 10 according to an example embodiment. The photoresist film 70 may be coated on the central portion of the wafer 30, and beads may be removed from the edge portion 30b adjacent to the edge 30c of the wafer 30. The rotary chuck 24 may be connected to the rotary shaft 22 and the stage driving unit 28.

In the EBR measurement and eccentricity measurement unit 14, a first image acquisition unit 50, capable of obtaining a first image of the edge portion 30b of the wafer 30, is disposed above the rotary chuck 24 and the wafer 30. The first image acquisition unit 50 may include a first camera 58 and a first optical system 59.

First light 53 emitted from the first light source 52 may be incident on the edge portion 30b of the wafer 30 via the mirror module 56 including the mirror 54. The first light 53 reflected or diffracted from the edge portion 30b of the wafer 30 may be incident on the first camera 58 via the mirror 54 and the lens 57 to obtain a first image of the wafer 30.

The first optical system 59 may include the first light source 52, the mirror module 56, the lens 57, and the like. In FIG. 6B, for convenience, the lens 57 is not shown. In addition, in FIGS. 6A and 6B, more optical elements may be included in the first optical system 59.

The first camera 58 may obtain the first image by photographing the edge portion 30b of the wafer 30. The first camera 58 may include a charge-coupled device (CCD)-type camera. In some example embodiments, the EBR measurement and eccentricity measurement unit 14 may be provided with an alignment mark sensor 60 for alignment of the wafer 30 on the rotary chuck 24. The alignment mark sensor 60 may be arranged at a position facing the first image acquisition unit 50, and may detect an alignment mark (not shown) formed on the wafer 30 to align with the wafer 30. In another implementation, the alignment mark sensor 60 may not be provided.

The stage driving unit 28 and the alignment mark sensor 60 may be connected to a control unit (not shown), and the control unit may rotate the stage driving unit 28 according to a signal from the alignment mark sensor 60 to align with the wafer 30. By operating the stage driving unit 28, the first image acquisition unit 50 may acquire a first image by photographing the edge portion 30b of the wafer 30.

According to the operation of the stage driving unit 28, the first image acquisition unit 50 may acquire a first image by photographing a notch 30a of the wafer 30 and the edge portion 30b of the wafer 30. The first image may be captured by photographing edge portions 30b of the wafer 30 in a circumferential direction of the wafer 30, as described in further detail below.

The captured first image may be transmitted to an image processing unit 76, as shown in FIG. 7. The image processing unit 76 may include a data processing unit 72 and a data storage unit 74. The image processing unit 76 may analyze the first image of the edge portion 30b of the wafer 30 to inspect a bead removal state of the edge portion 30b of the wafer 30.

The inspection of the bead removal state of the edge portion 30b of the wafer 30 may include detecting a width (W in FIG. 6B) or particles of the edge portion 30b of the wafer 30, from which the bead is removed, by analyzing the first image.

The width W, from which the bead of the edge portion is removed, may be a width between the wafer edge 30c and an edge 70a of the photoresist film 70. In the first image, the brightness (or gray level) of the line of pixels corresponding to the wafer edge 30c and the line of the pixels corresponding to the edge 70a of photoresist film may be higher than the lines of the pixels of the remaining portions.

By calculating a width (or interval) between the line of the pixels corresponding to the wafer edge 30c and the line of pixels corresponding to the photoresist film edge 70a and comparing the width W (or interval) with a preset value (reference value), a bead removal state of the edge portion 30b of the wafer 30 may be inspected. The preset value may be stored in the data storage unit 74, and the data processing unit 72 may compare the width W calculated from the first image with the preset value.

The image processing unit 76 may measure an eccentricity between the center of the rotary chuck 24 and the center of the wafer 30 by analyzing the first image of the edge portion 30b of the wafer 30. This will be described in further detail below.

FIGS. 8 to 17 are views for explaining a method of analyzing a first image obtained through an EBR measurement and eccentricity measurement unit of a wafer processing apparatus, according to an example embodiment.

Specifically, in FIGS. 8 to 17, the same reference numerals as in FIGS. 1 to 7 represent the same members. The first image of the edge portion 30b of the wafer 30, obtained by the EBR measurement and eccentricity measurement unit 14, may be analyzed through the image processing unit 76 to measure the eccentricity between the center of the rotary chuck 24 and the center of the wafer 30.

Figure 8:
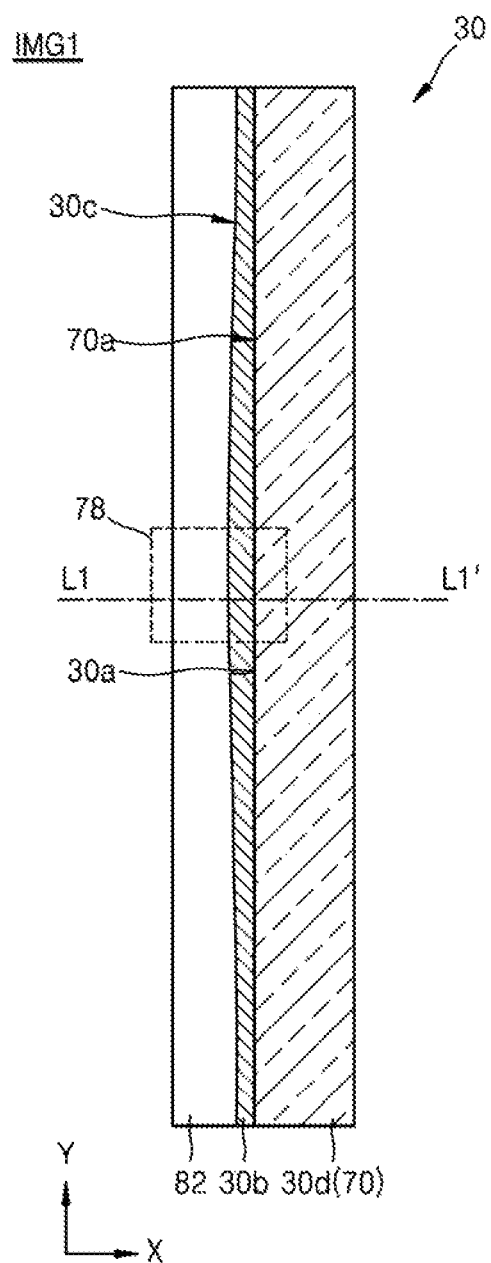
FIGS. 8 to 17 are views for explaining a method of analyzing a first image obtained through an EBR measurement and eccentricity measurement unit of a wafer processing apparatus, according to an example embodiment.
Figure 9:
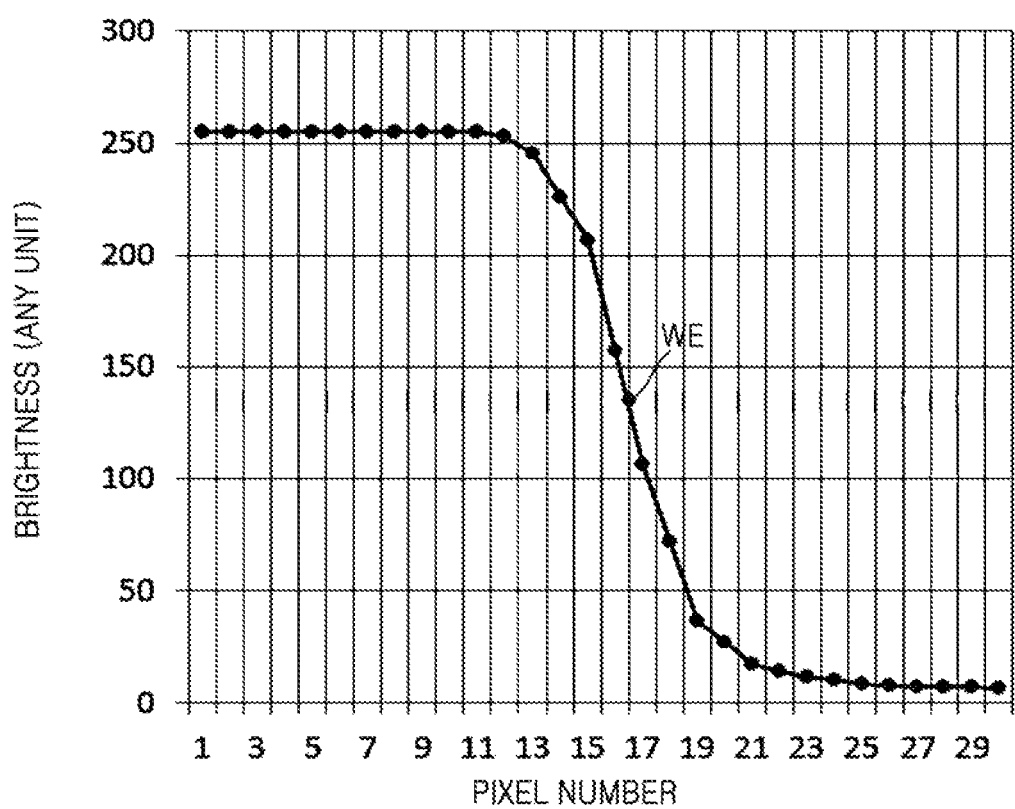

FIGS. 8 and 9 are diagrams for describing a method of finding a position of the edge 30c of the wafer 30 mounted on the rotary chuck 24.

Referring to FIG. 8, the first image acquisition unit 50 of the EBR measurement and eccentricity measurement unit 14 may acquire a first image by photographing a portion near the edge 30c of the wafer 30 in the circumferential direction of the wafer 30. FIG. 8 is a diagram illustrating the first image captured by photographing a portion near an edge of the wafer 30 in the circumferential direction of the wafer 30. For example, FIG. 8 may be a diagram of an image of 4096×10,000 pixels along the X-axis and Y-axis, respectively.

The first image of FIG. 8 may be referred to as a first step image IMG1 for convenience for distinction from those to be described in further detail below.

In FIG. 9, the Y-axis represents a circumferential direction of the wafer 30, and the X-axis represents a radial direction of the wafer 30.

In the first step image IMG1, the wafer 30 may include the first edge portion 30b (in which the photoresist film 70 is not present, adjacent to the edge 30c) and the second edge portion 30d (in which the photoresist film 70 is formed). The first edge portion 30b may be a portion from which the photoresist film is removed by the EBR process. Broadly, the first edge portion 30b and the second edge portion 30d may be collectively referred to as an edge portion or an integrated edge portion of the wafer 30.

In the first step image IMG1 of FIG. 8, the edge 70a of the photoresist film 70 is illustrated adjacent to the edge 30c of the wafer 30. The profile of the edge 30c of the wafer 30 in the Y direction from the first step image IMG1 may have a non-uniform line profile. In FIG. 8, reference numeral 30a represents a notch (or notch portion), and reference numeral 82 may correspond to a portion other than the first edge portion 30b and the second edge portion 30d.

Referring to FIG. 9, FIG. 9 shows brightness distributions of pixels of the line L1-L1' in the X direction by selecting partial regions 78 of the first edge portion 30b and the second edge portion 30d of FIG. 8. As shown in FIG. 9, it may be seen that the brightness of pixels of the wafer 30 in the radial direction has a curved shape from a maximum value to a minimum value.

In FIG. 9, each point represents the brightness of pixels. By cubic interpolation, the position of the 16.5th pixel, which is an intermediate value between the maximum value and the minimum value of the brightness of the pixels, may be found, thereby finding the position WE of the edge 30c of the wafer 30. Through FIGS. 8 and 9, the position or coordinates of the edge of the wafer 30 may be obtained on the X-Y plane.

FIGS. 10A, 10B, 10C, and 11 are views for obtaining the position or coordinates of the notch 30a of the wafer 30.

Figure 10A:
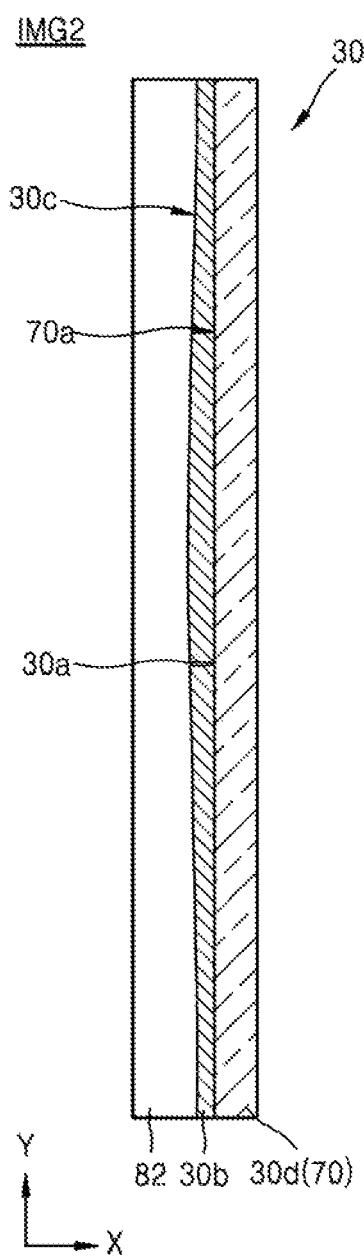

Referring to FIG. 10A, a second step image IMG2 shown in FIG. 10A may be an image obtained by reducing a width in the X direction in the first step image IMG1 of FIG. 9. FIG. 10A is a diagram illustrating an image captured by slightly reducing a region near the edge 30c in order to find the position of the notch 30a. For example, FIG. 10A is a diagram of an image of 500×10,000 pixels in the X-axis and Y-axis, respectively.

Figure 10B:
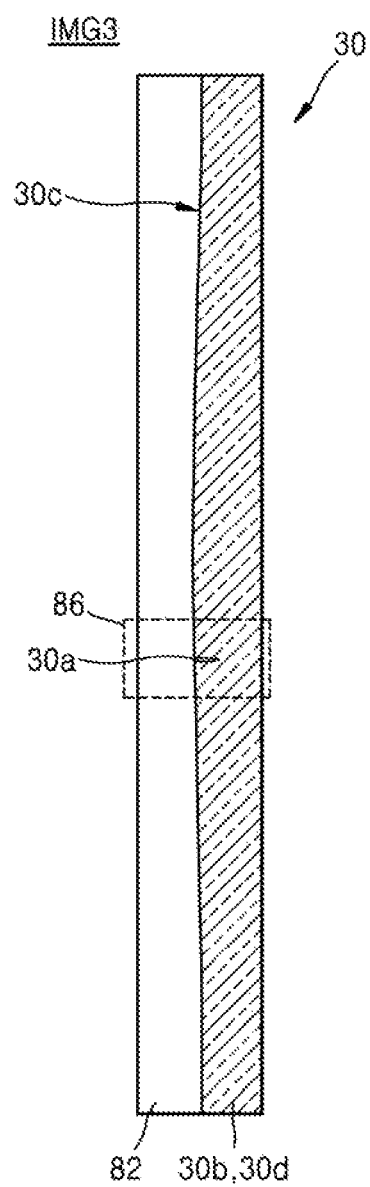
Figure 10C:
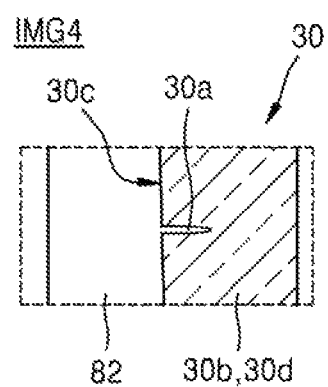

A third step image IMG3 shown in FIG. 10B may be an image binarized from the second step image IMG2. Accordingly, the first edge portion 30b in which the photoresist film 70 is not formed and the second edge portion 30d in which the photoresist film 70 is formed may be displayed as one portion.

In FIG. 10B, according to binarization, a hatch portion in a third step image IMG3, that is, the first edge portion 30b and the second edge portion 30d, may have a pixel value corresponding to 0, and a non-hatch portion 82 and the notch 30a may have a pixel value corresponding to 1. In the third step image IMG3, the notch 30a may be more clearly expressed through binarization of the second step image IMG2. A fourth step image IMG4 shown in FIG. 10C may be an enlarged image of a partial region 86 of the third step image IMG3 in order to more clearly describe and express the notch 30a.

Figure 11:
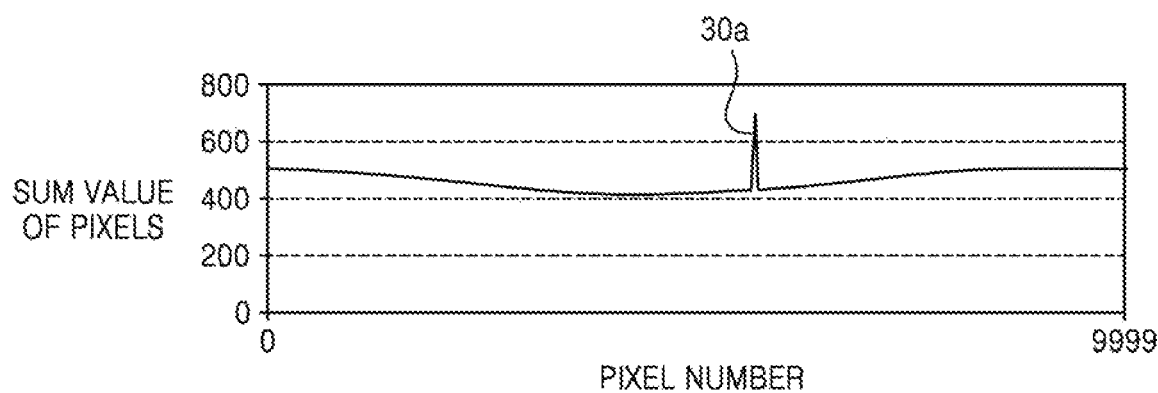

Referring to FIG. 11, FIG. 11 illustrates the sum value of pixels included in the third step image IMG3 in the circumferential direction of the wafer 30. As shown in FIG. 11, it may be seen that the sum value of pixels including the notch 30a is larger than that of the remaining portions. Through this, the position of the notch 30a can be obtained. Through FIGS. 10A, 10B, 10C, and 11, the position of the notch 30a of the wafer 30 and the angle at which the notch 30a is located may be obtained on the X-Y plane.

FIGS. 12 to 16 are diagrams for measuring and compensating for edge widths (or distances) of the first edge portions 30b and the second edge portions 30d along the circumferential direction of the wafer 30.

Figure 12:
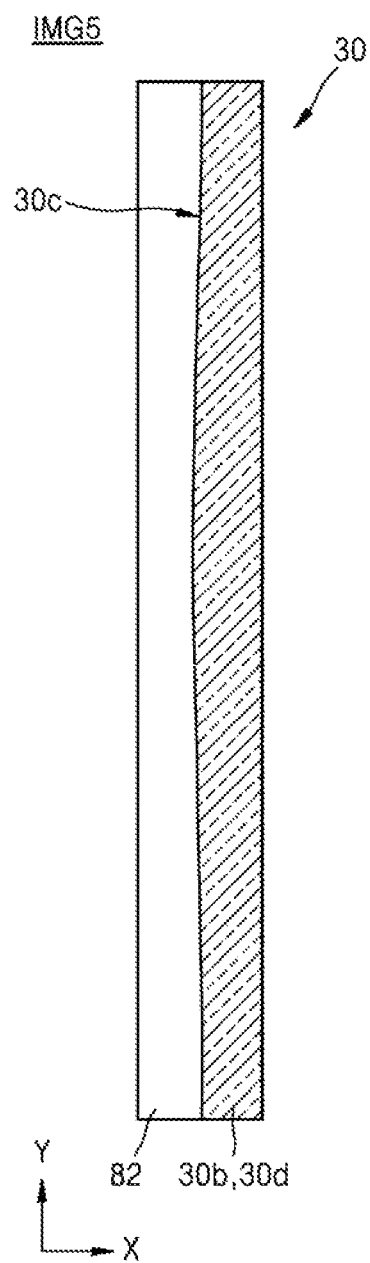

Referring to FIG. 12, a fifth step image IMG5 is an image obtained by removing the notch 30a of the third step image IMG3 through morphology processing. The radial edge widths (or edge distances) of the first edge portion 30b and the second edge portion 30d are measured along the circumferential direction of the wafer 30 using the fifth step image IMG5 of FIG. 12.

Figure 13:
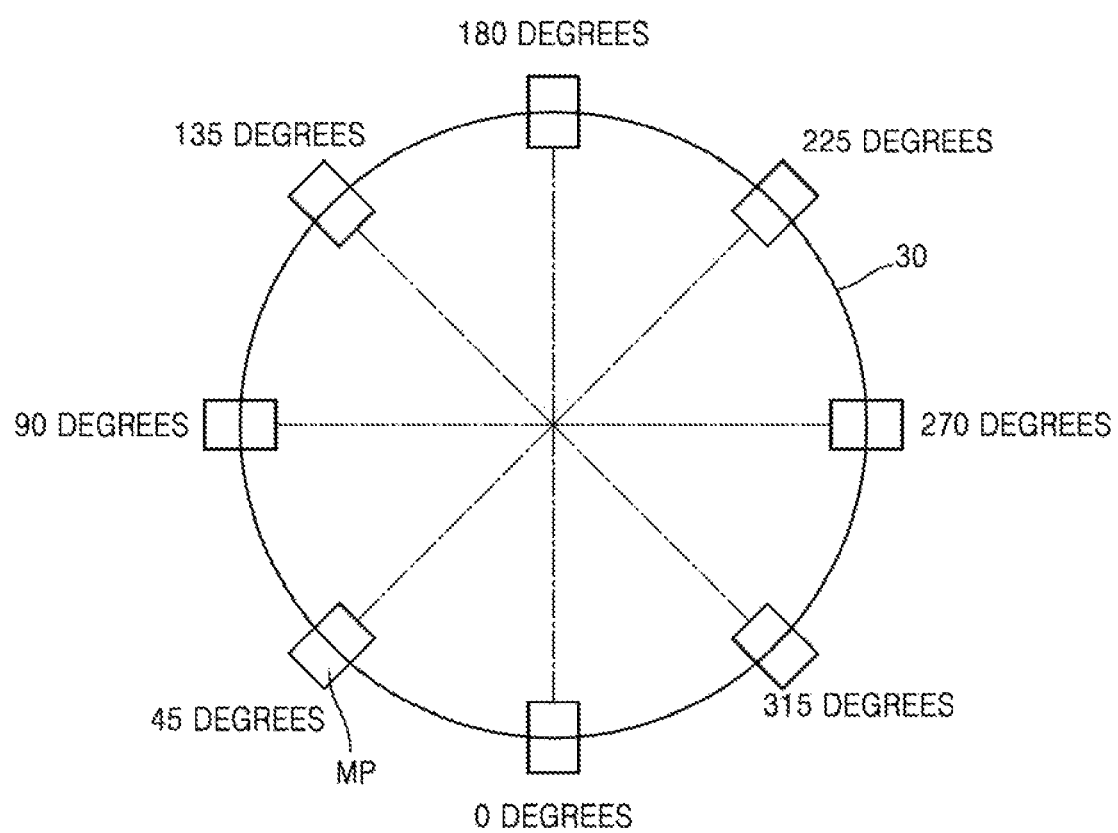

In some example embodiments, as shown in FIG. 13, at the time of measuring the edge widths (or edge distances) of the first edge portion 30b and the second edge portion 30d, a portion near an edge of the wafer 30 may be divided into several regions, e.g., eight measurement regions MP, and their edge widths (or distances) may be measured. In FIG. 13, angles are indicated in the circumferential direction of the wafer 30. As shown in FIG. 13, a downward direction of the wafer 30 is a 0 degree region, and the angles increase by 45 degrees in a clockwise direction.

Figure 14:
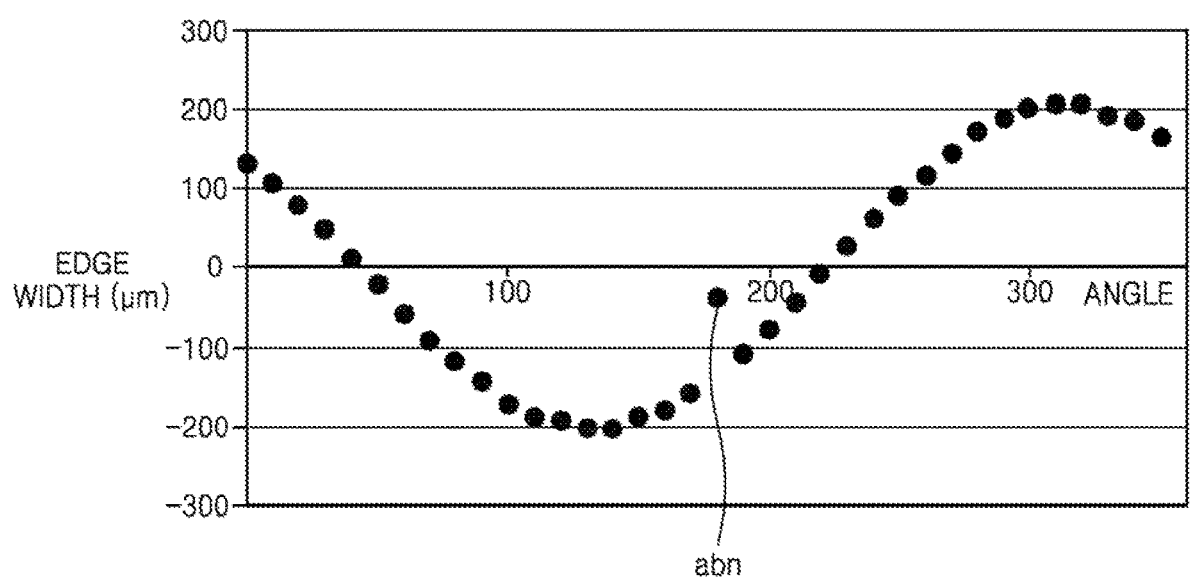
Figure 15:
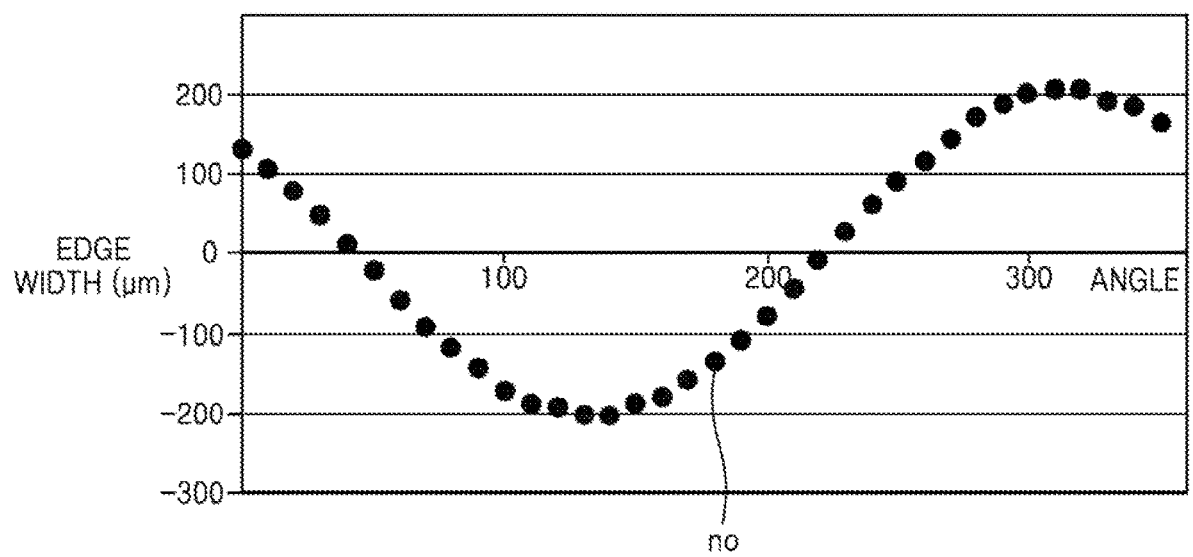

Referring to FIGS. 14 and 15, FIGS. 14 and 15 show that edge widths (or edge distances) in the radial directions of the first edge portion 30b and the second edge portion 30d are measured in the circumferential direction of the wafer 30. In FIGS. 14 and 15, the X-axis may represent the angles in the circumferential direction of the wafer 30, and the Y-axis may represent the edge widths (or distances) of the first edge portion 30b and the second edge portion 30d. In FIGS. 14 and 15, each of the points may refer to an edge width (or edge distance) in the radial direction of the wafer 30.

As shown in FIG. 14, an abnormal value "abn" is removed from among the measured edge widths. Subsequently, as shown in FIG. 15, a graph drawn by measuring the radial edge widths (or edge distances) of the first edge portion 30b and the second edge portion 30d according to the circumferential direction of the wafer 30 may be completed after changing the abnormal value "abn" to a normal value "no" through data fitting.

Figure 16:
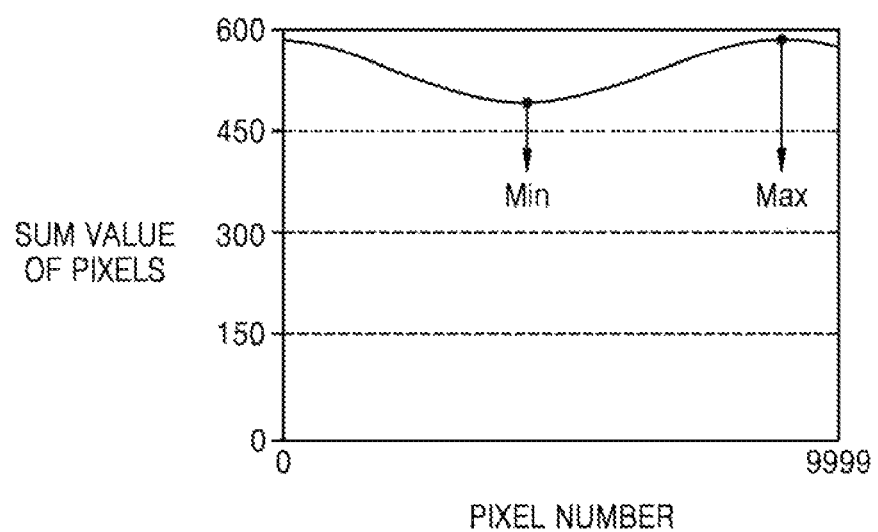

Referring to FIG. 16, FIG. 16 illustrates the sum value of pixels included in the fifth step image IMG5 in the circumferential direction of the wafer 30 after projection processing using the fifth step image IMG5 of FIG. 12. As shown in FIG. 16, the sum value of pixels may have a maximum value Max and a minimum value Min. A compensation value of the edge width measured previously according to Equation 1 (below) may be obtained using the pixel sum value.

Compensation value=Maximum value (Max)−
 [(Maximum value (Max)−Minimum value
 (Min))/2]−[The pixel sum value of pixels of the
 position to be compensated in the circumferen-
 tial direction]     (Equation 1)

Through this process, the edge widths (or edge distances) of the first edge portion 30b and the second edge portion 30d may be corrected with the compensation value, and finally, an eccentricity control value (eccentricity control factor) may be derived to correct an eccentricity between the center of the rotary chuck 24 and the center of the wafer 30. In other words, an eccentricity control value (eccentricity control factor) between the center of the rotary chuck 24 and the center of the wafer 30 may be derived according to the edge position of the wafer 30 and the widths of the first and second edge portions 30b and 30d of the wafer 30 in the radial direction of the wafer 30 along the circumferential direction of the wafer 30, through pixel analysis of the first image. As a result, the eccentricity control value (eccentricity control factor) may be derived through the radius of the wafer 30, detection of the edge of the wafer 30, detection of the notch 30a of the wafer 30, measurement of the edge width, and correction of the compensation value.

Figure 17:
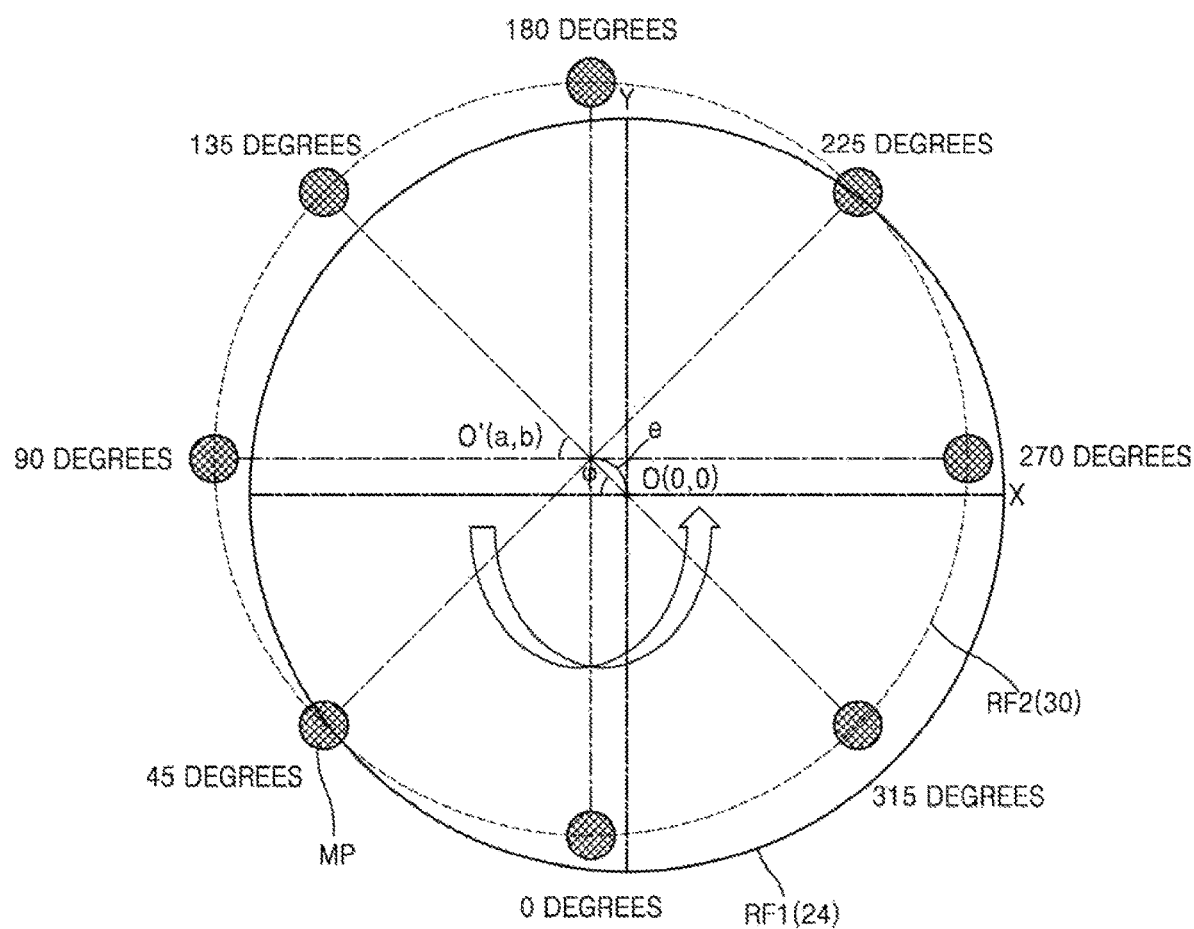

FIG. 17 is a diagram illustrating correcting an eccentricity between the center of the rotary chuck 24 and the center of the wafer 30. In FIG. 17, RF1 illustrates a trajectory of the rotary chuck 24, and a center (or center coordinate) of the rotary chuck 24 may be O (or (0,0)). RF2 illustrates a trajectory of the wafer 30, and the center (or center coordinate) of the wafer 30 may be O' (or (a,b)).

When the center O' (a,b) of the wafer 30 does not match the center O (0,0) of the rotary chuck 24, the center coordinate O' (a,b) of the wafer 30 may be matched to the center coordinate O (0,0) of the rotary chuck 24 using the eccentricity control value (eccentricity control factor) described above. The eccentricity control value (eccentricity control factor) may include a position difference value "e" between the center O (0,0) of the rotary chuck 24 and the center O' (a,b) of the wafer 30 in the X direction (horizontal direction), and a position difference value "φ" between the center O (0,0) of the rotary chuck 24 and the center O' (a,b) of the wafer 30 in the θ direction (rotation direction).

The position difference value "e" in the X direction (horizontal direction) may be $a^2+b^2$, and the position difference value "φ" in the θ direction (rotation direction) may be $\tan^{-1} b/a$. By rotating the wafer 30 by an angle "φ" in the counterclockwise direction of the θ direction (rotation direction), and moving the wafer 30 by a distance "e" in the +X direction, the center O' (a,b) of the wafer 30 may be made to coincide with the center O (0,0) of the rotary chuck 24.

Figure 18:
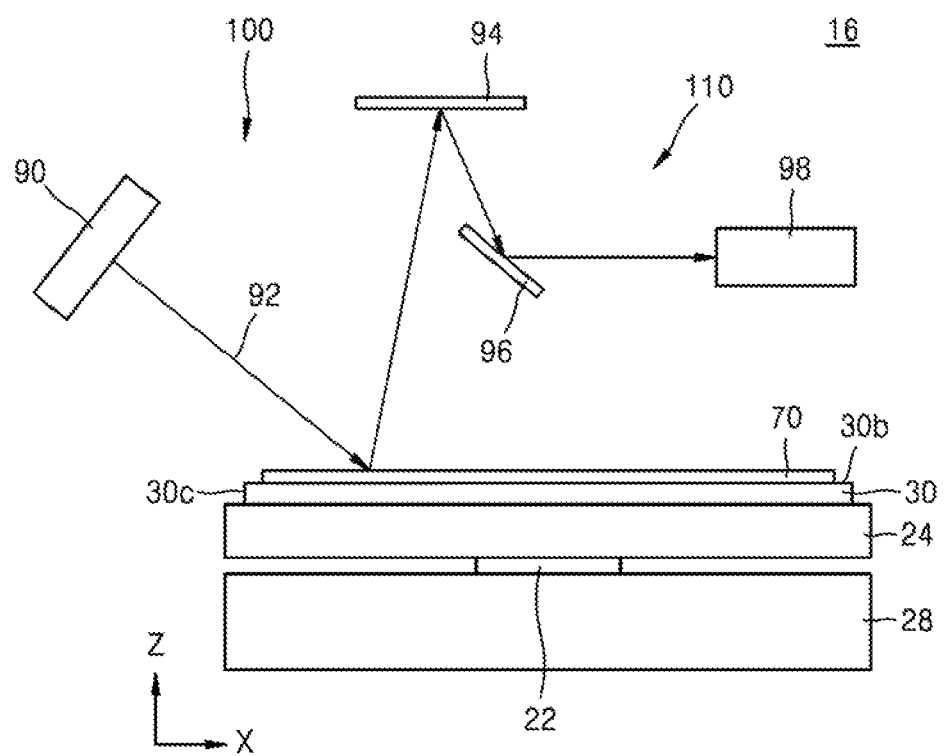
FIG. 18 is a cross-sectional view illustrating a macro defect inspection unit used in a wafer processing apparatus according to an example embodiment.
Figure 19:
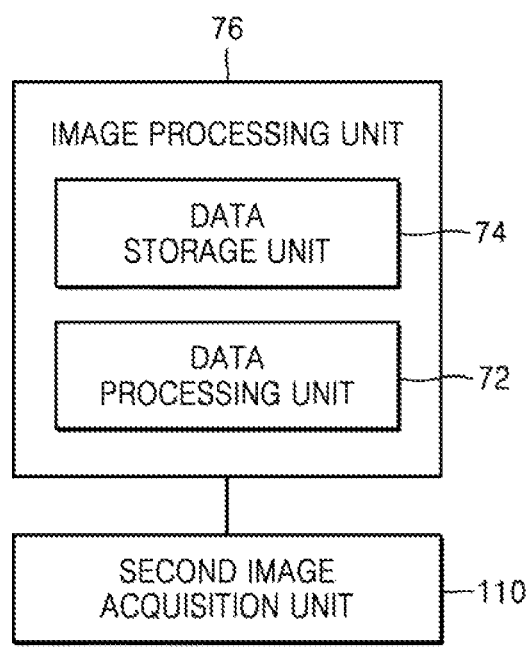
FIG. 19 is a block diagram illustrating image processing of the macro defect inspection unit of FIG. 18.

FIG. 18 is a cross-sectional view illustrating a macro defect inspection unit used in a wafer processing apparatus according to an example embodiment, and FIG. 19 is a block diagram illustrating image processing of the macro defect inspection unit of FIG. 18.

Specifically, in FIG. 18, the same reference numerals as in FIGS. 1 to 5 represent the same members. The wafer 30, passing through the EBR measurement and eccentricity measurement unit 14 as described above, may be transferred to a macro defect inspection unit 16 by the X-θ stage unit 12.

The photoresist film 70 may be coated on the central portion of the wafer 30, and beads may be removed from the edge portion 30b adjacent to the edge 30c of the wafer 30. The rotary chuck 24 may be connected to the rotary shaft 22 and the stage driving unit 28.

The macro defect inspection unit 16 is provided with a second image acquisition unit 110 capable of obtaining a second image of a surface portion of the wafer 30. The second image acquisition unit 110 may include a second camera 98 and a second optical system 100.

Second light 92 emitted from a second light source 90 may be incident on the wafer 30. The second light 92 reflected or diffracted from the wafer 30 may be incident on the second camera 98 via mirrors 94 and 96 to obtain a second image of the wafer 30. The second camera 98 may obtain the second image by photographing the surface of the wafer 30. The second camera 98 may be a line-type camera.

The macro defect inspection unit 16 may inspect the surface state of the wafer 30 by analyzing the second image. The second optical system 100 may include the second light source 90 and the mirrors 94 and 96. In FIG. 18, more optical elements may be included in the second optical system 100. According to the operation of the stage driving unit 28, the second image acquisition unit 110 may acquire the second image by photographing the notch 30a of the wafer 30 and the surface of the wafer 30.

The captured second image may be transmitted to the image processing unit 76, as shown in in FIG. 19. The image processing unit 76 may include the data processing unit 72 and the data storage unit 74 as described above. The image processing unit 76 may analyze the surface of the wafer 30 and the second image of the notch 30a to inspect the surface defect state of the wafer 30.

The surface state inspection of the wafer 30 may include a pattern state of the photoresist film 70, presence or absence of particles, and detection of the position of the notch 30a, on the wafer 30, by analyzing the pixels of the second image.

Figure 20:
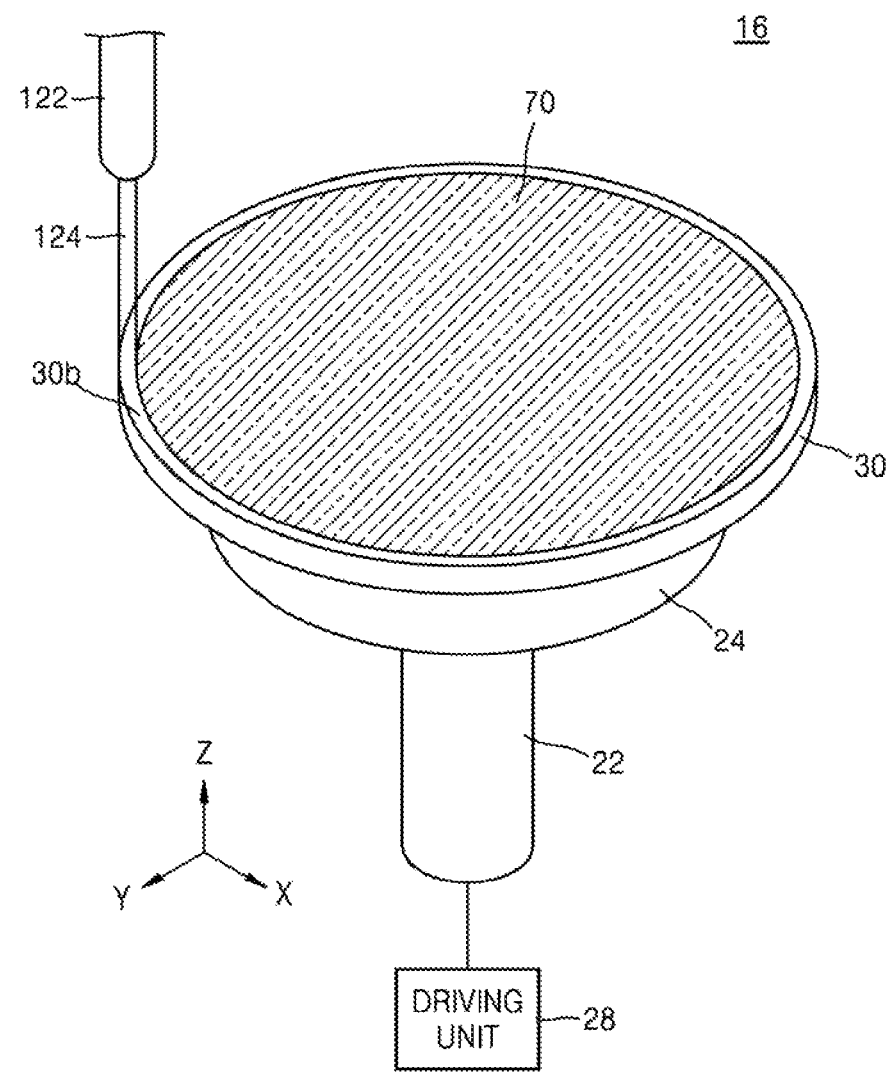
FIGS. 20 and 21 are a perspective view and a cross-sectional view, respectively, for describing an edge exposure of wafer (EEW) process unit used in a wafer processing apparatus according to an example embodiment.
Figure 21:
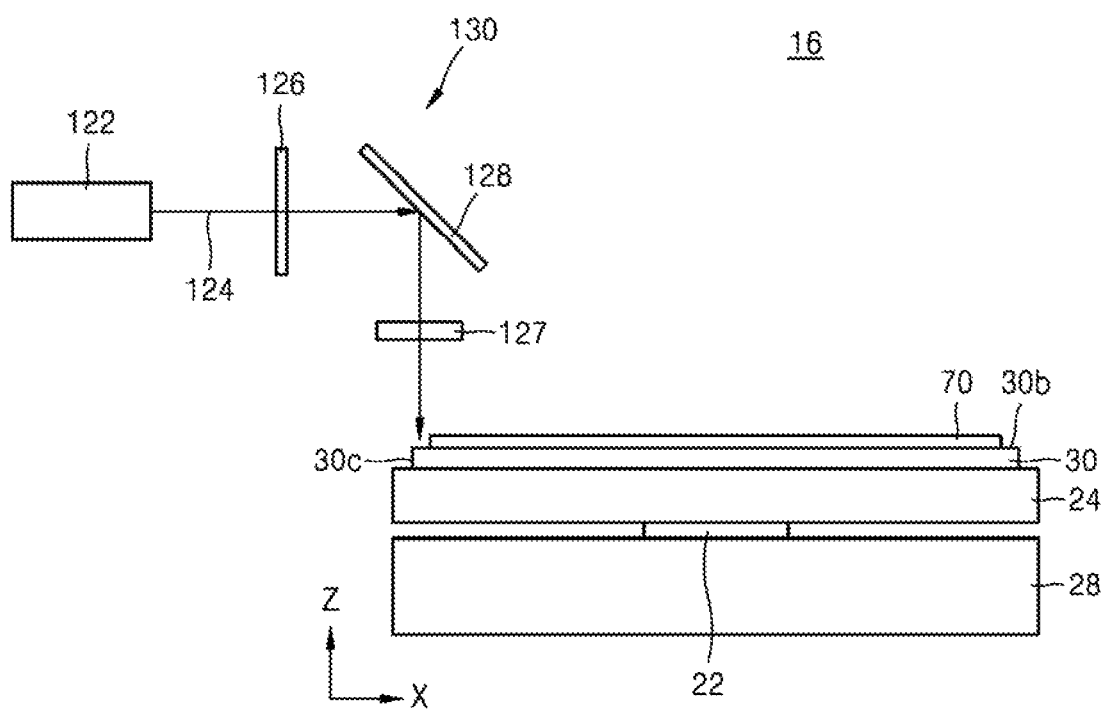

FIGS. 20 and 21 are a perspective view and a cross-sectional view, respectively, for describing an EEW process unit used in a wafer processing apparatus according to an example embodiment.

Specifically, in FIGS. 20 and 21, the same reference numerals as in FIGS. 1 to 5 represent the same members. The wafer 30 passing through the macro defect inspection unit 16, as described above, may be transferred to the EEW process unit 18 by the X-θ stage unit 12.

The photoresist film 70 may be coated on the central portion of the wafer 30, and beads may be removed from the edge portion 30b adjacent to the edge 30c of the wafer 30. The rotary chuck 24 may be connected to the rotary shaft 22 and the stage driving unit 28.

The EEW process unit 18 may expose the edge portion of the wafer 30 after correcting the eccentricity between the center of the rotary chuck 24 and the center of the wafer 30, measured by the EBR measurement and eccentricity measurement unit 14. The EEW process unit 18 may apply third light 124 to the photoresist film 70 formed at the edge portion of the wafer 30.

The EEW process unit 18 may include a third optical system 130 capable of applying the third light 124 to the edge portion 30b of the wafer 30. The third light 124 emitted from a third light source 122 may be incident on the wafer 30 through a lens 126, a mirror 128, and a lens 127. The EEW process unit 18 may apply third light 124 to the photoresist film 70 formed at the edge portion 30b of the wafer 30.

The third optical system 130 may include the third light source 122, the lenses 126 and 127, and the mirror 128. In FIGS. 20 and 21, more optical elements may be included in the third optical system 130.

Figure 22:
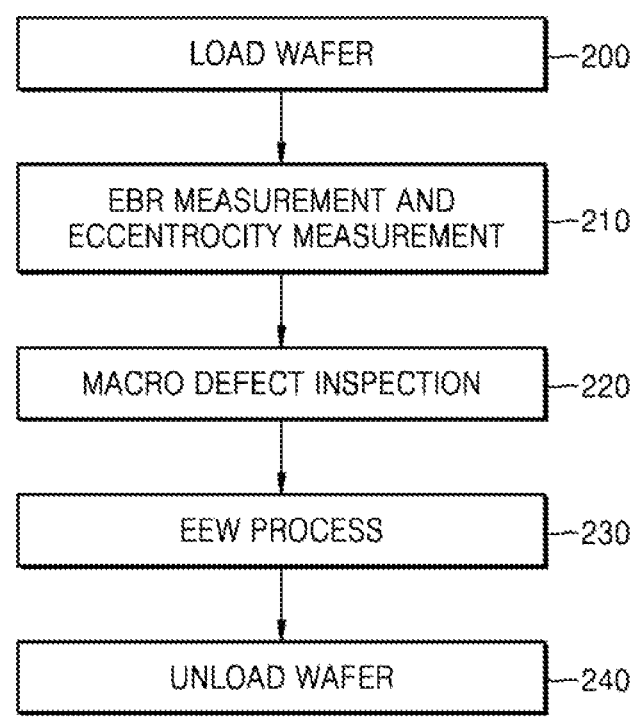
FIG. 22 is a flowchart illustrating a wafer processing method performed by a wafer processing apparatus, according to an example embodiment.

FIG. 22 is a flowchart illustrating a wafer processing method performed by a wafer processing apparatus, according to an example embodiment.

Specifically, in FIG. 22, the same reference numerals as in FIGS. 1 to 5 represent the same members. As described above, the wafer 30 that has undergone the EBR process in the EBR device 40 may be loaded on the rotary chuck 24 of the EBR measurement and eccentricity measurement unit 14 of the wafer processing apparatus 10 (operation 200).

The EBR measurement and eccentricity measurement unit 14 inspects the bead removal state of the edge portion 30b of the wafer 30, and measures the eccentricity between the center of the rotary chuck 24 and the center of the wafer 30 (operation 210).

The wafer 30 located on the rotary chuck 24 in the EBR measurement and eccentricity measurement unit 14 may be transferred to the macro defect inspection unit 16 by the stage driving unit 28 of the X-θ stage unit 12, to undergo a macro defect inspection (operation 220). The macro defect inspection unit 16 may inspect the surface state of the wafer 30.

The wafer 30 located on the rotary chuck 24 in the macro defect inspection unit 16 may be transferred to the EEW process unit 18 by the stage driving unit 28 of the X-θ stage unit 12, to undergo an EEW process (operation 230). The EEW process unit 18 performs the EEW process of exposing the edge portion 30b of the wafer 30 after correcting the eccentricity between the center of the rotary chuck 24 and the center of the wafer 30, as measured by the EBR measurement and eccentricity measurement unit 14.

After the EEW process, the wafer 30 located on the rotary chuck 24 in the EEW process unit 18 may be unloaded to the outside, after being subjected to the macro defect inspection unit 16 and the EBR measurement and eccentricity measurement unit 14, by the stage driving unit 28 of the X-θ stage unit 12 (operation 240).

In a further example embodiment, after the EEW process, the wafer 30 located on the rotary chuck 24 in the EEW process unit 18 may further undergo macro defect inspection in the macro defect inspection unit 16 using the stage driving unit 28 of the X-θ stage unit 12.

Figure 23:
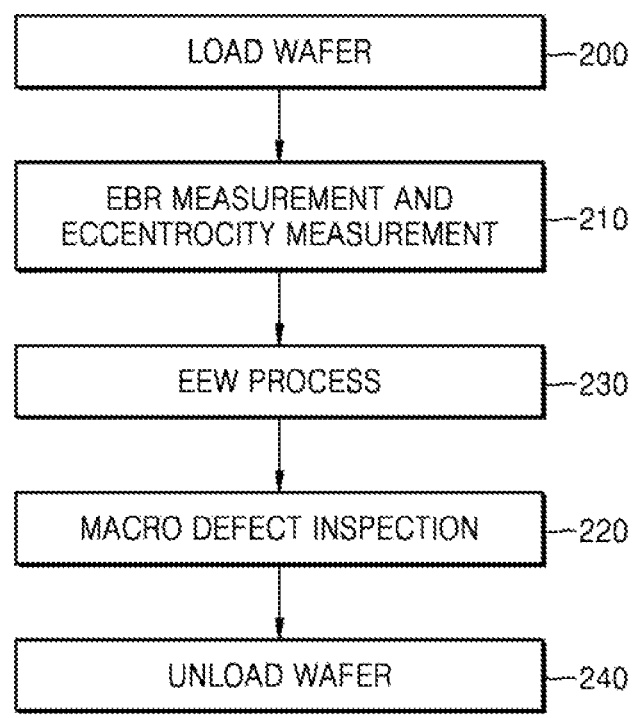
FIG. 23 is a flowchart illustrating a wafer processing method performed by a wafer processing apparatus, according to an example embodiment.

FIG. 23 is a flowchart illustrating a wafer processing method performed by a wafer processing apparatus, according to an example embodiment.

Specifically, in FIG. 23, the same reference numerals as in FIGS. 1 to 5 represent the same members. The wafer processing method of FIG. 23 may be the same as that of FIG. 22, when comparing FIG. 23 with FIG. 22, except that macro defect inspection is performed after the EEW process.

As described above, the wafer 30, which has undergone the EBR process in the EBR device 40, may be loaded on the rotary chuck 24 of the EBR measurement and eccentricity measurement unit 14 of the wafer processing apparatus 10 (operation 200).

The EBR measurement and eccentricity measurement unit 14 inspects the bead removal state of the edge portion 30b of the wafer 30, and measures the eccentricity between the center of the rotary chuck 24 and the center of the wafer 30 (operation 210).

The wafer 30, located on the rotary chuck 24 in the EBR measurement and eccentricity measurement unit 14, may be transferred to the EEW process unit 18 by the stage driving unit 28 of the X-θ stage unit 12, to undergo an EEW process (operation 230). The EEW process unit 18 performs the EEW process of exposing the edge portion of the wafer 30 after correcting the eccentricity between the center of the rotary chuck 24 and the center of the wafer 30, as measured by the EBR measurement and eccentricity measurement unit 14.

After the EEW process, the wafer 30, located on the rotary chuck 24 in the EEW process unit 18, may be transferred to the macro defect inspection unit 16 by the stage driving unit 28 of the X-θ stage unit 12, to undergo a macro defect inspection (operation 220). The macro defect inspection unit 16 may inspect the surface state of the wafer 30.

The wafer 30, located on the rotary chuck 24 in the macro defect inspection unit 16, may be unloaded to the outside via the EBR measurement and eccentricity measurement unit 14 using the stage driving unit 28 of the X-θ stage unit 12, to undergo the EEW process (operation 240). In a further example embodiment, before the EEW process, the wafer 30, located on the rotary chuck 24 in the EBR measurement and eccentricity measurement unit 14, may further undergo macro defect inspection in the macro defect inspection unit 16 using the stage driving unit 28 of the X-θ stage unit 12.

By way of summation and review, a wafer processing apparatus may be implemented to inspect or evaluate a surface state of a wafer having undergone an EBR process and an EEW process, in addition to performing the EBR process and the EEW process on the wafer.

As described above, embodiments relate to a wafer processing apparatus used in a photolithography process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wafer processing apparatus, comprising:
    an X-θ stage unit having a rotary chuck configured to move in an X direction, which is a horizontal direction, to rotate in a θ direction, which is a rotation direction, and to mount a wafer thereon;
    an edge bead removal (EBR) measurement and eccentricity measurement unit located on an upper portion of the X-θ stage unit, and configured to inspect a bead removal state of an edge portion of the wafer, which is adjacent to an edge of the wafer, and to measure eccentricity between a center of the rotary chuck and a center of the wafer; and
    an edge exposure of wafer (EEW) process unit located on the upper portion of the X-θ stage unit on one side of the EBR measurement and eccentricity measurement unit, and configured to expose the edge portion of the wafer after correcting the eccentricity between the center of the rotary chuck and the center of the wafer as measured by the EBR measurement and eccentricity measurement unit,
    wherein the EBR measurement and eccentricity measurement unit includes only one image acquisition unit using a single camera to provide both EBR measurement and eccentricity measurement, configured to obtain a first image of the edge portion of the wafer,
    wherein the EBR measurement and eccentricity measurement unit is configured to inspect the bead removal state of the edge portion of the wafer based on the first image, and
    wherein the EBR measurement and eccentricity measurement unit is configured to measure the eccentricity between the center of the rotary chuck and the center of the wafer based on the first image.

2. The wafer processing apparatus as claimed in claim 1, wherein the X-θ stage unit includes:
    a rotary shaft connected to the rotary chuck; and
    a stage driving unit configured to move the rotary shaft in the X direction with respect to a surface of the wafer, and to rotate the rotary shaft in the θ direction.

3. The wafer processing apparatus as claimed in claim 1, wherein the image acquisition unit includes:
    a first optical system configured to apply light to the wafer; and
    a first camera configured to obtain the first image by photographing the edge portion of the wafer.

4. The wafer processing apparatus as claimed in claim 1, wherein:
    the image acquisition unit is connected to an image processing unit, and
    the image processing unit is configured to analyze the first image to measure the eccentricity between the center of the rotary chuck and the center of the wafer.

5. The wafer processing apparatus as claimed in claim 1, further comprising a macro defect inspection unit provided on the upper portion of the X-θ stage unit, between the EBR measurement and eccentricity measurement unit and the EEW process unit.

6. The wafer processing apparatus as claimed in claim 5, wherein the macro defect inspection unit includes a second image acquisition unit configured to obtain a second image of a surface state of the wafer.

7. The wafer processing apparatus as claimed in claim 6, wherein the second image acquisition unit includes:
    a second optical system configured to apply light to the wafer; and a second camera configured to photograph a surface of the wafer to obtain the second image.

8. The wafer processing apparatus as claimed in claim 1, wherein the EEW process unit includes a third optical system configured to apply light to the edge portion of the wafer.

9. A wafer processing apparatus, comprising:
an X-θ stage unit configured to move in an X direction, which is a horizontal direction, and having a rotary chuck configured to rotate in a θ direction, which is a rotation direction, the rotary chuck being configured to mount a wafer thereon;
an edge bead removal (EBR) measurement and eccentricity measurement unit located on an upper portion of the X-θ stage unit, and configured to inspect a bead removal state of a first edge portion of the wafer, which is adjacent to an edge of the wafer and on which a photoresist film is not applied, and configured to measure eccentricity between a center of the rotary chuck and a center of the wafer;
a macro defect inspection unit located on the upper portion of the X-θ stage unit on one side of the EBR measurement and eccentricity measurement unit, and configured to inspect a surface state of the wafer; and
an edge exposure of wafer (EEW) process unit located on the upper portion of the X-θ stage unit on one side of the macro defect inspection unit and the EBR measurement and eccentricity measurement unit, and configured to expose the first edge portion and a second edge portion, which is adjacent to the first edge portion and on which the photoresist film is applied, after correcting the eccentricity between the center of the rotary chuck and the center of the wafer as measured by the EBR measurement and eccentricity measurement unit,
wherein the EBR measurement and eccentricity measurement unit includes only one image acquisition unit using a single camera to provide both EBR measurement and eccentricity measurement, configured to obtain a first image of the first edge portion of the wafer,
wherein the EBR measurement and eccentricity measurement unit is configured to inspect the bead removal state of the first edge portion of the wafer based on the first image, and
wherein the EBR measurement and eccentricity measurement unit is configured to measure the eccentricity between the center of the rotary chuck and the center of the wafer based on the first image.

10. The wafer processing apparatus as claimed in claim 9, wherein:
the image acquisition unit is configured to obtain the first image by photographing the first and second edge portions along a circumferential direction of the wafer, and
the eccentricity between the center of the rotary chuck and the center of the wafer is measured through pixel analysis of the first image acquired by the image acquisition unit.

11. The wafer processing apparatus as claimed in claim 10, wherein:
the image acquisition unit is connected to an image processing unit, and
the image processing unit is configured to derive an eccentricity control factor between the center of the rotary chuck and the center of the wafer according to an edge position of the wafer and widths of the first and second edge portions in a radial direction of the wafer through the pixel analysis of the first image.

12. The wafer processing apparatus as claimed in claim 11, wherein the eccentricity control factor includes:
a position difference value in the X direction between the center of the rotary chuck and the center of the wafer, and
a position difference value in the θ direction between the center of the rotary chuck and the center of the wafer.

13. The wafer processing apparatus as claimed in claim 11, wherein the X-θ stage unit includes:
a rotary shaft connected to the rotary chuck; and
a stage driving unit configured to move the rotary shaft in the X direction with respect to a surface of the wafer, and to rotate the rotary shaft in the θ direction, and
the EEW process unit is configured to adjust the eccentricity control factor using the stage driving unit.

14. The wafer processing apparatus as claimed in claim 9, wherein the macro defect inspection unit includes a second image acquisition unit configured to obtain a second image of the surface state of the wafer.

15. The wafer processing apparatus as claimed in claim 14, wherein the second image acquisition unit is connected to an image processing unit that is configured to detect a notch of the wafer through pixel analysis of the second image.

16. A wafer processing apparatus, comprising:
an X-θ stage unit having a rotary chuck configured to move in an X direction, which is a horizontal direction, to rotate in a θ direction, which is a rotation direction, and to mount a wafer thereon;
an edge bead removal (EBR) measurement and eccentricity measurement unit located on an upper portion of the X-θ stage unit, and including a first image acquisition unit configured to inspect a bead removal state of an edge portion of the wafer, which is adjacent to an edge of the wafer, and to measure eccentricity between a center of the rotary chuck and a center of the wafer;
a macro defect inspection unit located on the upper portion of the X-θ stage unit on one side of the EBR measurement and eccentricity measurement unit, and including a second image acquisition unit configured to inspect a surface state of the wafer; and
an edge exposure of wafer (EEW) process unit located on the upper portion of the X-θ stage unit on one side of the macro defect inspection unit, and including a third optical system configured to expose the edge portion of the wafer after correcting the eccentricity between the center of the rotary chuck and the center of the wafer as measured by the EBR measurement and eccentricity measurement unit,
wherein the first image acquisition unit includes only one image acquisition unit using a single camera to provide both EBR measurement and eccentricity measurement, configured to obtain a first image of the edge portion of the wafer,
wherein the EBR measurement and eccentricity measurement unit is configured to inspect the bead removal state of the edge portion of the wafer based on the first image, and
wherein the EBR measurement and eccentricity measurement unit is configured to measure the eccentricity between the center of the rotary chuck and the center of the wafer based on the first image.

17. The wafer processing apparatus as claimed in claim 16, wherein:
the first image acquisition unit includes:
a first optical system; and
a first camera configured to obtain a first image of the edge portion of the wafer,
the first image acquisition unit is connected to an image processing unit, and
the image processing unit is configured to analyze the first image of the edge portion of the wafer to measure the eccentricity between the center of the rotary chuck and the center of the wafer.

18. The wafer processing apparatus as claimed in claim 16, wherein:
the second image acquisition unit includes:
a second optical system; and
a second camera configured to obtain a second image of the surface state of the wafer by photographing the wafer,
the second image acquisition unit is connected to an image processing unit, and
the image processing unit is configured to analyze the second image of the surface state of the wafer.

19. The wafer processing apparatus as claimed in claim 16, wherein the X-θ stage unit includes:
a rotary shaft connected to the rotary chuck, and
a stage driving unit configured to move the wafer mounted on the rotary chuck between the EBR measurement and eccentricity measurement unit, the macro defect inspection unit, and the EEW process unit, and to rotate the rotary shaft in the θ direction.

* * * * *